US012389713B1

(12) United States Patent
Anshu

(10) Patent No.: US 12,389,713 B1
(45) Date of Patent: Aug. 12, 2025

(54) SOLAR PANEL

(71) Applicant: Tilahun Anshu, Lowell, MA (US)

(72) Inventor: Tilahun Anshu, Lowell, MA (US)

( * ) Notice: Subject to any disclaimer, the term of this patent is extended or adjusted under 35 U.S.C. 154(b) by 14 days.

(21) Appl. No.: 18/244,975

(22) Filed: Sep. 12, 2023

Related U.S. Application Data

(63) Continuation-in-part of application No. 17/718,440, filed on Apr. 12, 2022.

(51) Int. Cl.
*H02S 40/22* (2014.01)
*H10F 10/16* (2025.01)
*H10F 19/20* (2025.01)
*H10F 77/42* (2025.01)

(52) U.S. Cl.
CPC ........... *H10F 77/484* (2025.01); *H02S 40/22* (2014.12); *H10F 10/16* (2025.01); *H10F 19/20* (2025.01)

(58) Field of Classification Search
CPC ....... H01L 31/00–078; Y02E 10/50–60; H02S 40/20–22; H10F 19/00–908; H10F 77/00–959
USPC .................................................. 136/243–265
See application file for complete search history.

(56) References Cited

U.S. PATENT DOCUMENTS

| | | | |
|---|---|---|---|
| 4,511,755 A * | 4/1985 | Mori | F21S 11/00 136/246 |
| 6,660,930 B1 | 12/2003 | Gonsiorawski | |
| 7,557,291 B2 | 7/2009 | Flaherty | |
| 8,921,683 B2 | 12/2014 | Hu | |
| 10,720,539 B2 | 7/2020 | Santoleri | |
| 2009/0205699 A1* | 8/2009 | Chang | H01L 31/0543 136/246 |
| 2010/0108133 A1* | 5/2010 | Bhagavatula | H01L 31/0547 136/256 |
| 2012/0012163 A1 | 1/2012 | Yu | |
| 2012/0073746 A1 | 3/2012 | Zahnd | |
| 2013/0008500 A1 | 1/2013 | Lin | |
| 2013/0104979 A1* | 5/2013 | Huang | H01L 31/0543 136/259 |
| 2014/0090692 A1* | 4/2014 | Okamoto | H01L 31/048 136/246 |
| 2014/0112617 A1* | 4/2014 | Pagani | G02B 6/12002 438/69 |
| 2021/0286126 A1* | 9/2021 | Bae | H02S 40/22 |
| 2023/0369525 A1* | 11/2023 | Corbett | H01L 31/072 |

* cited by examiner

*Primary Examiner* — Bach T Dinh

(57) ABSTRACT

The improved solar panel includes a photovoltaic collection system, a lens structure and a calliport structure. The calliport structure is a photon manifold. The calliport structure is formed in the silicon crystalline structure of the NP junction of each individual photovoltaic cell contained within the photovoltaic collection structure. The calliport structure captures a proportion of the photons that are redirected by the lens structure. The calliport structure discharges the redirected photons into the N crystalline layer and the P crystalline layer through refraction and ejection processes. The calliport structure directly injects photons into the depletion zone of the P crystalline layer such that the net electric current production of the individual photovoltaic cell is increased relative to a standard photoelectric cell.

9 Claims, 12 Drawing Sheets

SOLAR PANEL

CROSS REFERENCES TO RELATED APPLICATIONS

This non-provisional application claims priority under 35 USC 120 to United States non-provisional application U.S. Ser. No. 17/718,440 filed on Apr. 12, 2022 by the inventor: Tilahun Anshu of Lowell, MA. This non-provisional application claims United States non-provisional application U.S. Ser. No. 17/718,440 in its entirety.

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of optical elements adapted for use in concentrating light on a photovoltaic cell. (H01L31/0547)

SUMMARY OF PRIOR DISCLOSURE

This non-provisional application claims priority under 35 USC 120 to United States non-provisional application U.S. Ser. No. 17/718,440 filed on Apr. 12, 2022 by the inventor: Tilahun Anshu. Within this disclosure, the non-provisional application U.S. Ser. No. 15/464,448 will also be referred to as the prior disclosure. A summary of the disclosures contained within the prior disclosure that are relevant to the present disclosure is provided below. This summary is provided for clarity and convenience and is not intended to fully represent or reflect the disclosures contained within the prior disclosure. If a discrepancy occurs between this summary and the prior disclosure, the prior disclosure should be considered correct and this summary should be considered in error.

The prior disclosure describes an optical structure that concentrates the light that falls on a photovoltaic cell during the production of electric energy. The prior disclosure describes a photovoltaic collection structure 103 and a lens structure 104. The lens structure 104 is an optical structure that redirects the rays of electromagnetic radiation 151 that falls on the lens structure 104 such that the amount of electromagnetic radiation 151 that falls on each individual photovoltaic cell 132 contained in the photovoltaic collection structure 103 is increased relative to what it otherwise would be.

SUMMARY OF PHOTOVOLTAIC CELL OPERATION

This section of the background describes the physical process underlying the operation of a photovoltaic cell.

Each individual photovoltaic cell 132 selected from the photovoltaic collection system 103 is a semiconducting structure. Each individual photovoltaic cell 132 is formed as an NP junction 331. The NP junction 331 is formed as a silicon based crystalline structure that is subdivided into two "doped" crystalline layers. By doping is meant that an element other than silicon is introduced into the crystalline structure of the doped crystalline layer. The N crystalline layer 332 is doped with an element that has 5 valence electrons (such as phosphorous or arsenic) in its electrically neutral state. The P crystalline layer 333 is doped with an element that has 3 valence electrons (such as boron) in its electrically neutral state. The N crystalline layer 332 presents to the NP junction 331 an excess of electrons within its crystalline structure. Similarly, the P crystalline layer 333 presents to the NP junction 331 a deficiency of electrons within its crystalline structure. This deficiency of electrons are referred to as holes. A "depletion zone" 334 forms at the interface of the junction between the N crystalline layer 332 and the P crystalline layer 333. The depletion zone 334 is the area within the P crystalline layer 333 where the holes have essentially been filled through their ability to capture excess electrons from the N crystalline layer 332.

The NP junction 331 is a controllable technology that is exploited in switch and amplifier circuits. Specifically, the NP junction 331 can be used to control and limit the amount of electric current that can flow through the NP junction 331. The key to controlling the amount of electric current flowing through the NP junction 331 is to control the span of the depth of the depletion zone 334 into the P crystalline layer 333. The span of the depth of the depletion zone 334 can be controlled using a method selected from the group consisting of: a) applying an electric voltage across the NP junction 331; b) injecting electrons into the P crystalline layer 333 of the NP junction 331; and c) exposing the depletion zone 334 to light.

The depth of the depletion layer 334 of the individual photovoltaic cell 132 is controlled by exposing the NP junction 331 to light. Specifically, when a photon strikes an electron in the depletion layer 334 that has been captured by a hole, the photon transfers the energy necessary to: a) release the electron from the hole; with, b) enough energy to allow the electron to escape the from the NP junction 331. The escape the electrons from the NP junction 331 generates an electric current that can be used as a source of electric energy.

SUMMARY OF INVENTION

The improved solar panel is an improvement made to the prior disclosure. The improved solar panel comprises the photovoltaic collection system, the lens structure and a calliport structure. The calliport structure is a photon manifold. The calliport structure is formed in the silicon crystalline structure of the NP junction of each individual photovoltaic cell contained within the photovoltaic collection structure. The calliport structure captures a proportion of the photons that are redirected by the lens structure. The calliport structure discharges the redirected photons into the N crystalline layer and the P crystalline layer through refraction and ejection processes. The calliport structure directly injects photons into the depletion zone of the P crystalline layer such that the net electric current production of the individual photovoltaic cell is increased relative to a standard photoelectric cell.

These together with additional objects, features and advantages of the improved solar panel will be readily apparent to those of ordinary skill in the art upon reading the following detailed description of the presently preferred, but nonetheless illustrative, embodiments when taken in conjunction with the accompanying drawings.

In this respect, before explaining the current embodiments of the improved solar panel in detail, it is to be understood that the improved solar panel is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the improved solar panel.

It is therefore important that the claims be regarded as including such equivalent construction insofar as they do not depart from the spirit and scope of the improved solar panel. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
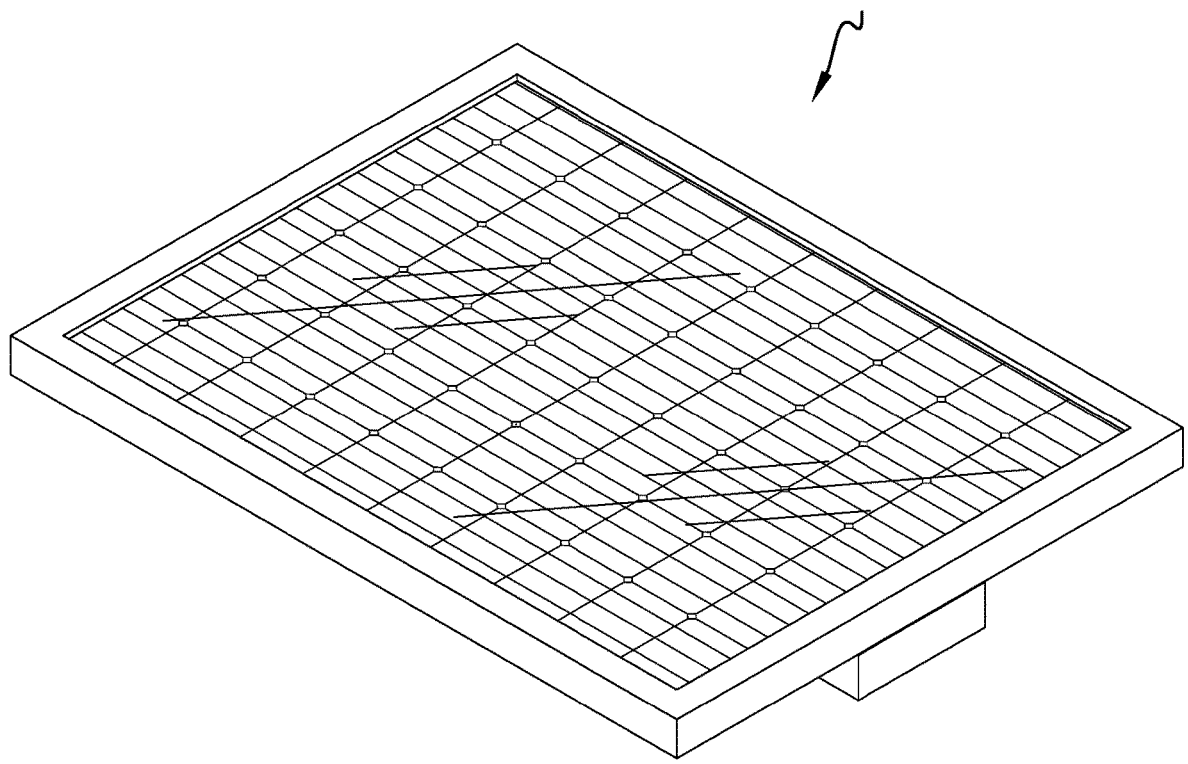
FIG. 1 is a perspective view of an embodiment of the disclosure.
Figure 2:
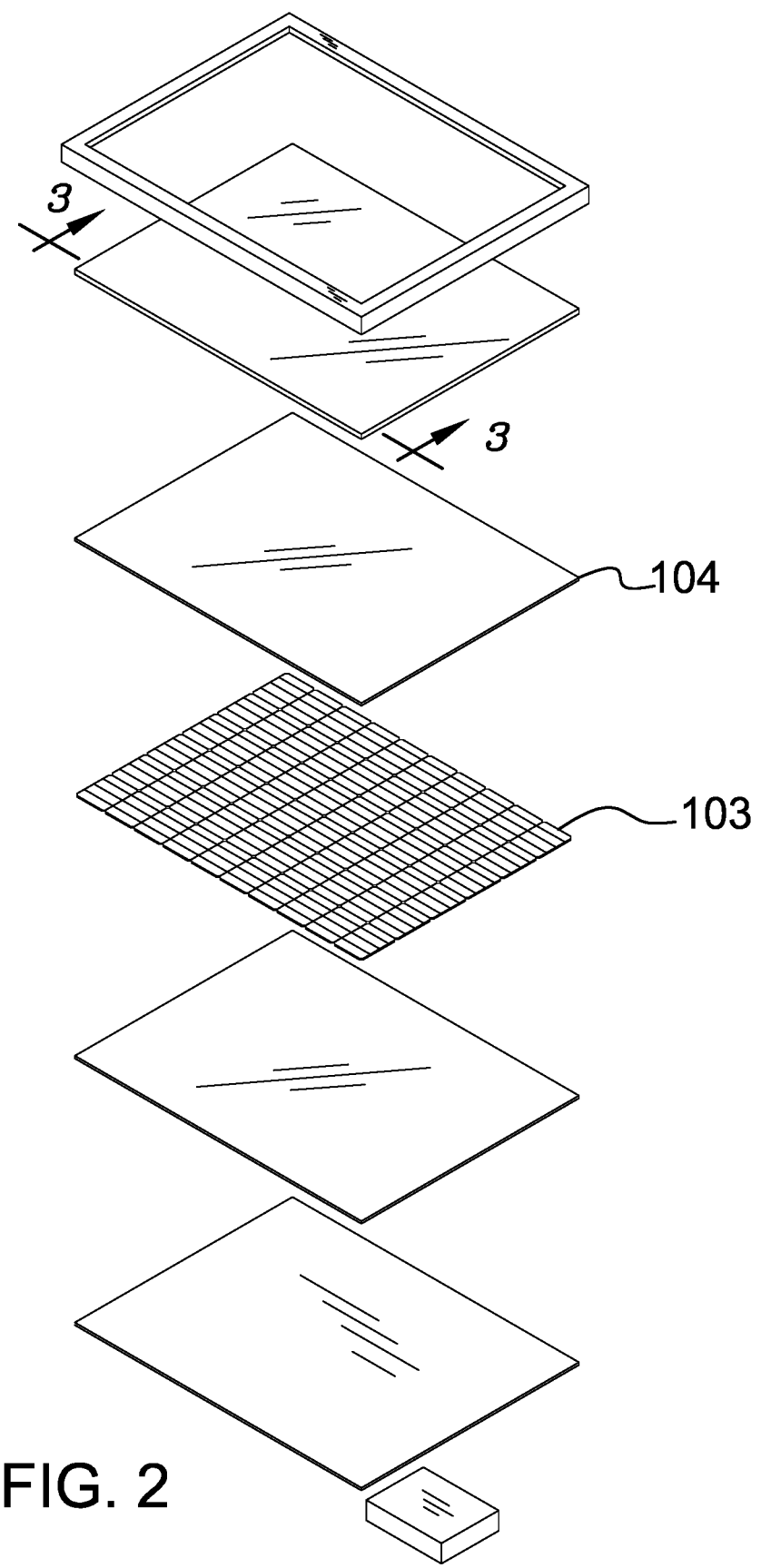
FIG. 2 is an exploded view of an embodiment of the disclosure.
Figure 3:
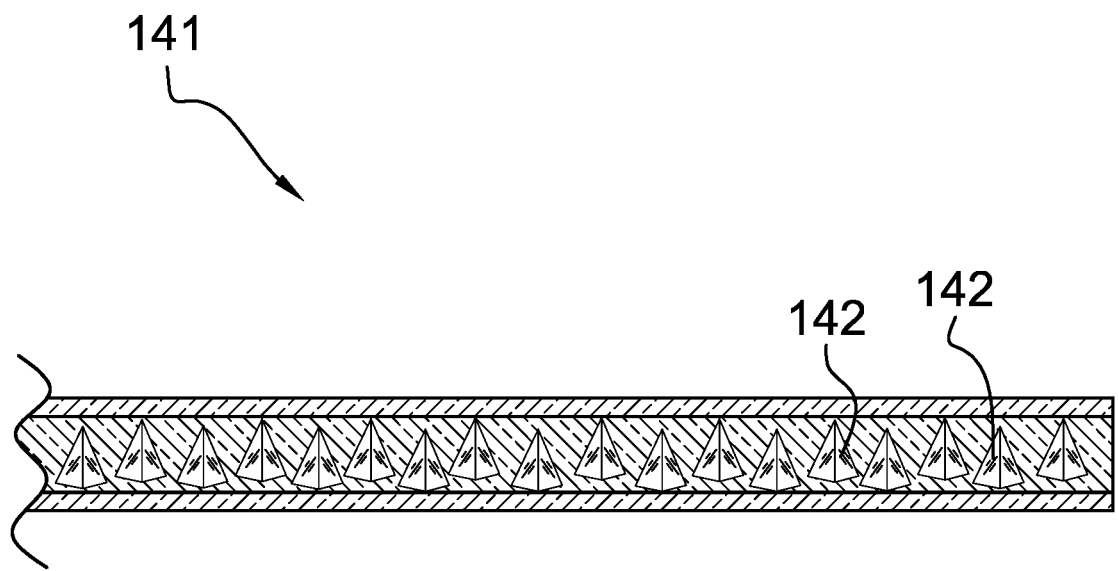
FIG. 3 is a cross-sectional view of an embodiment of the disclosure.
Figure 4:
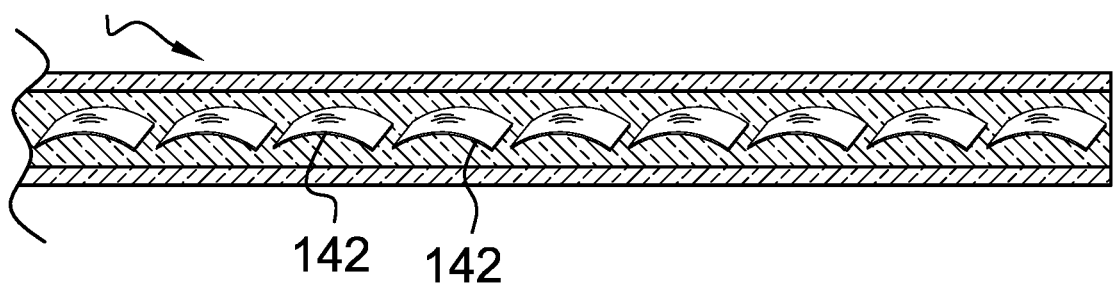
FIG. 4 is a cross-sectional view of an alternate embodiment of the disclosure.
Figure 5:
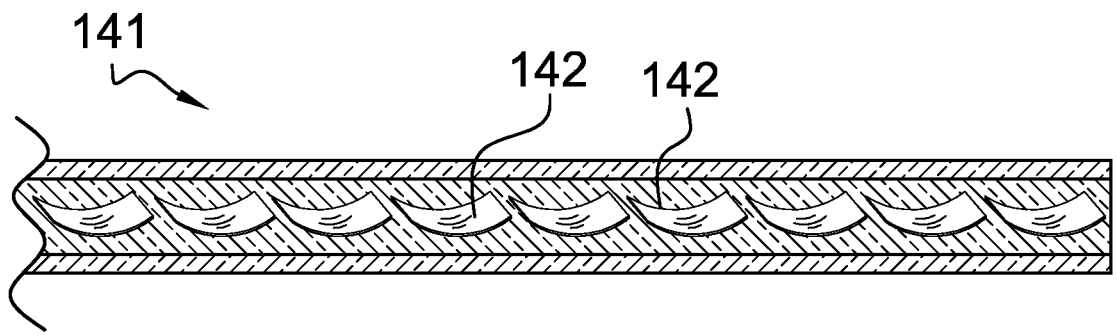
FIG. 5 is a cross-sectional view of an alternate embodiment of the disclosure.
Figure 6:
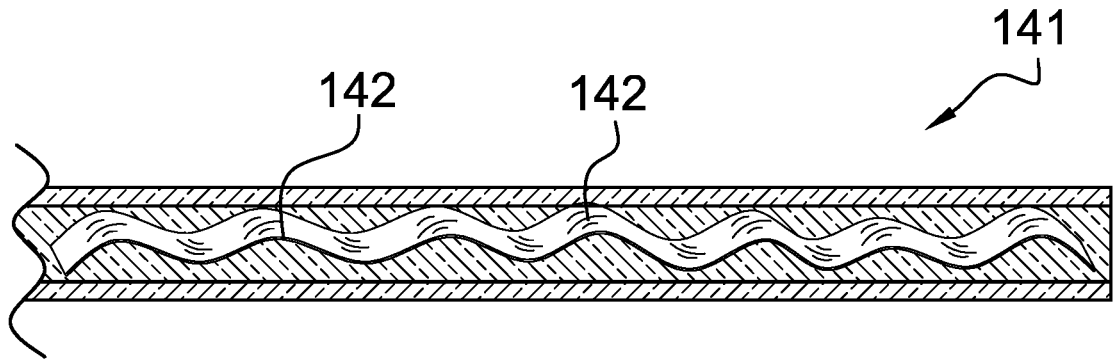
FIG. 6 is a cross-sectional view of an alternate embodiment of the disclosure.
Figure 7:
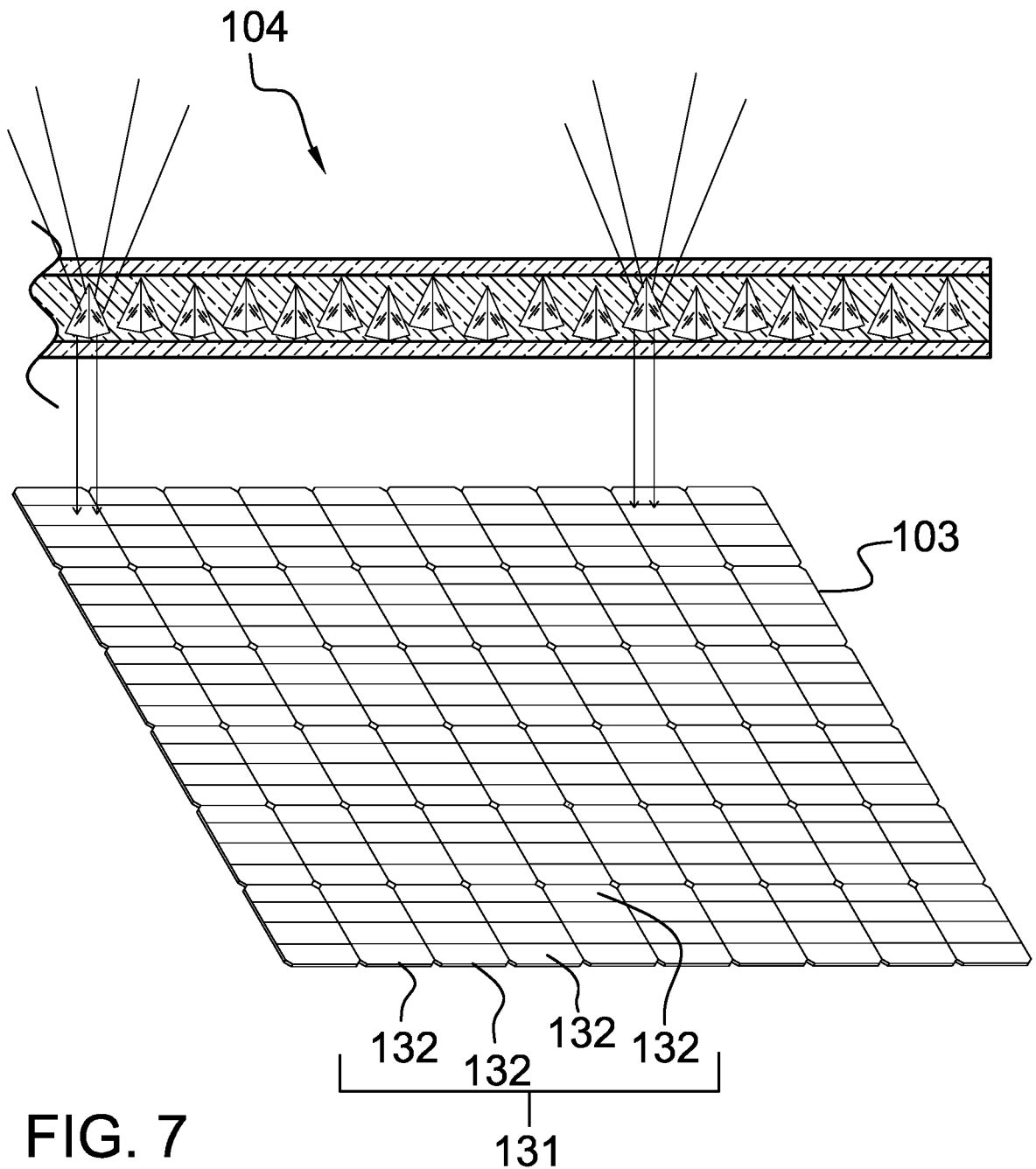
FIG. 7 is a detail view of an embodiment of the disclosure.
Figure 8:
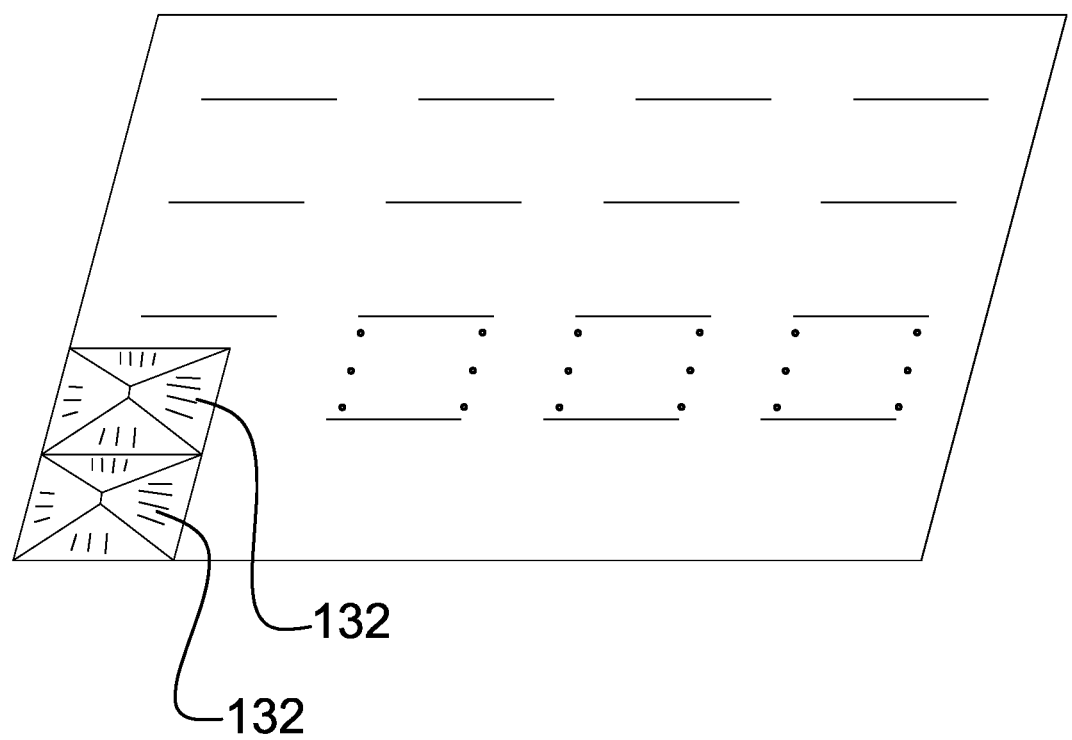
FIG. 8 is a detail view of an alternate embodiment of the disclosure.
Figure 9:
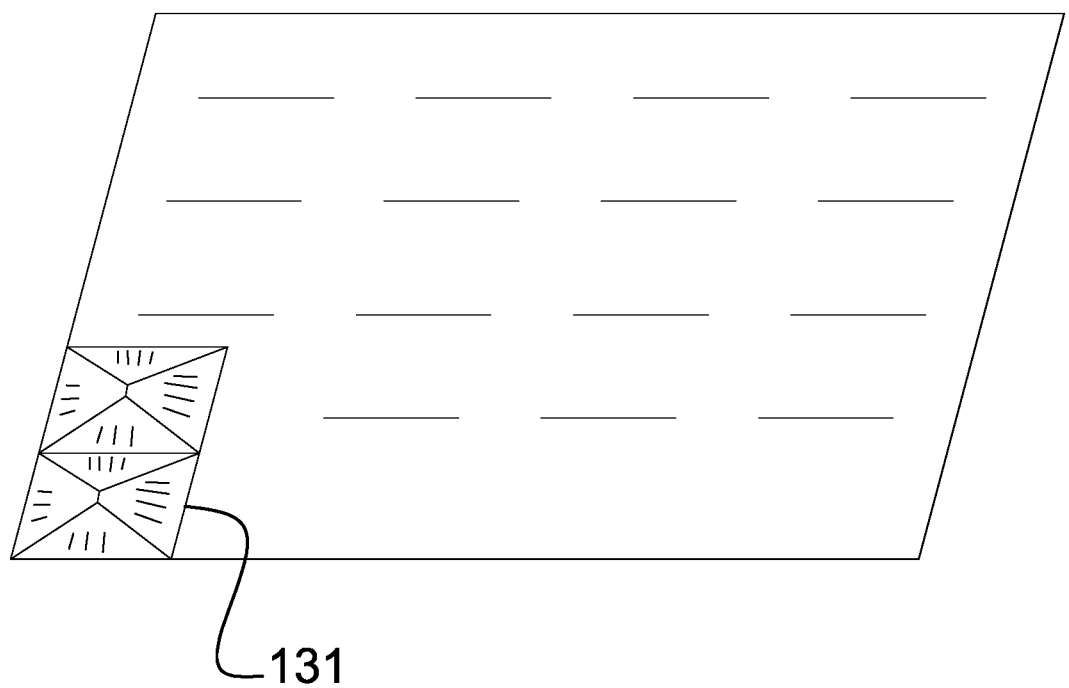
FIG. 9 is a detail view of an alternate embodiment of the disclosure.
Figure 10:
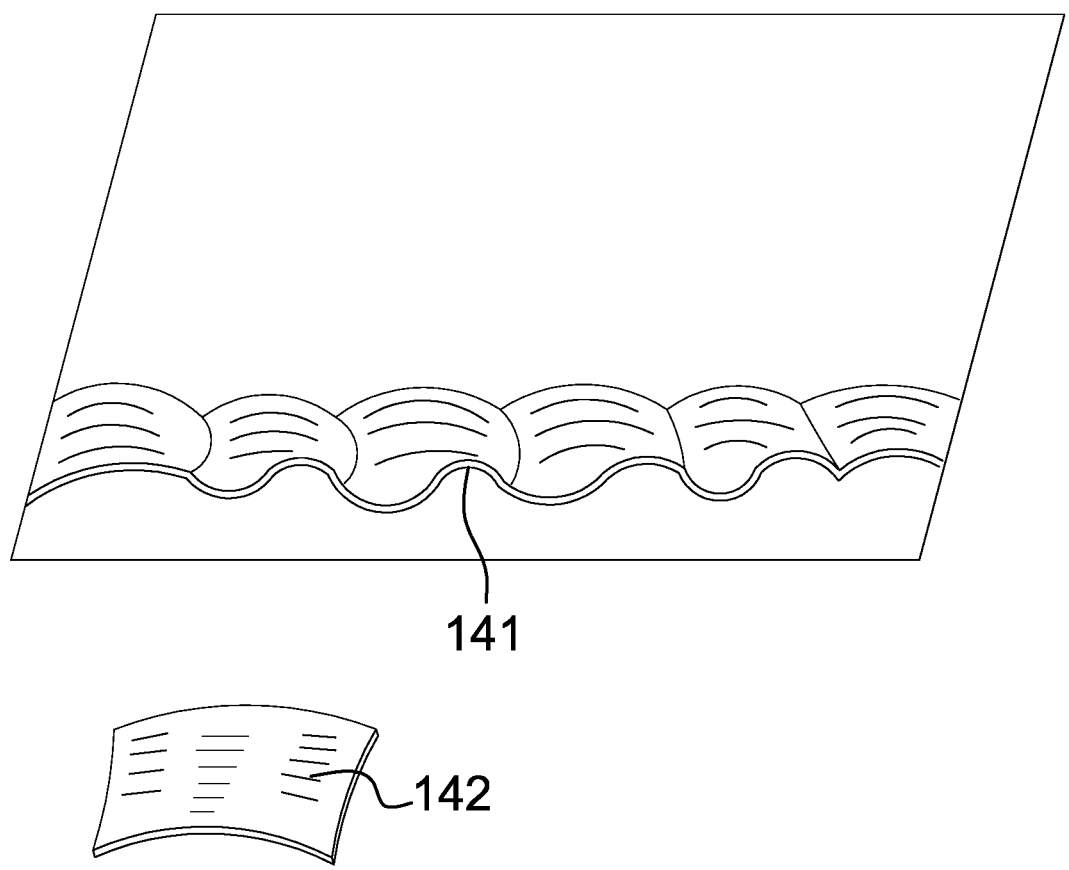
FIG. 10 is a detail view of an alternate embodiment of the disclosure.
Figure 11:
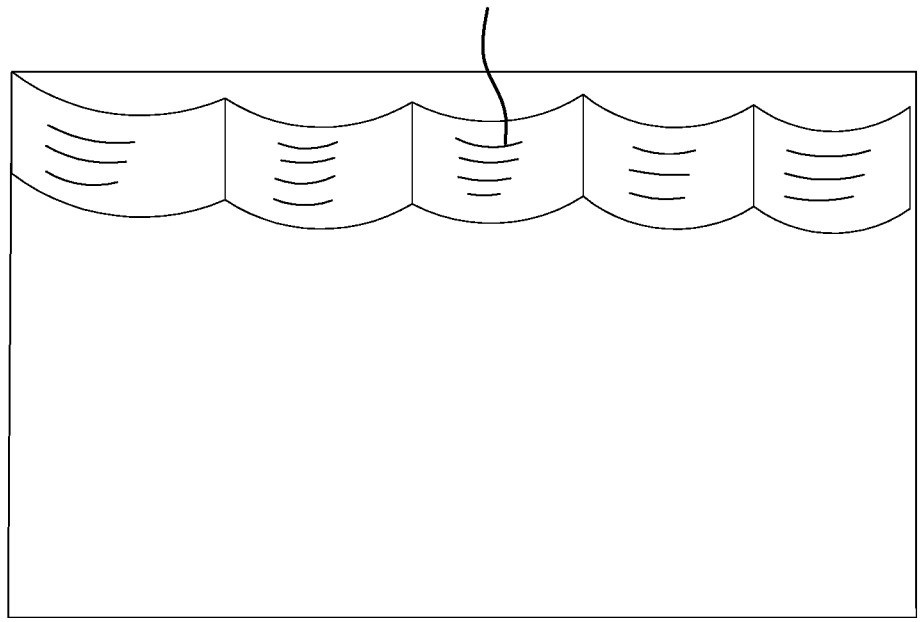
FIG. 11 is a detail view of an alternate embodiment of the disclosure.
Figure 11:
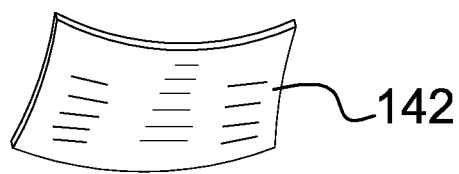
Figure 12:
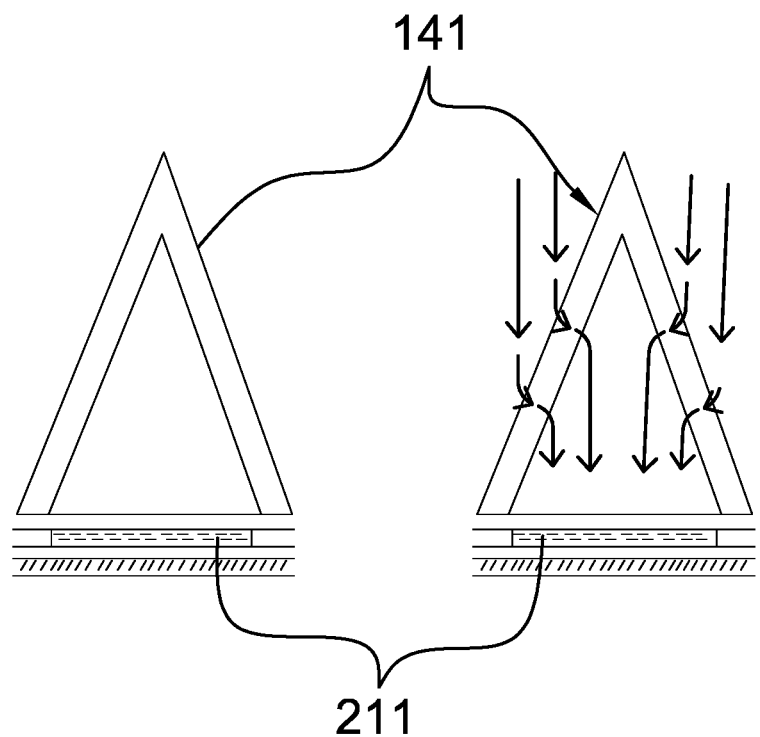
Figure 13:
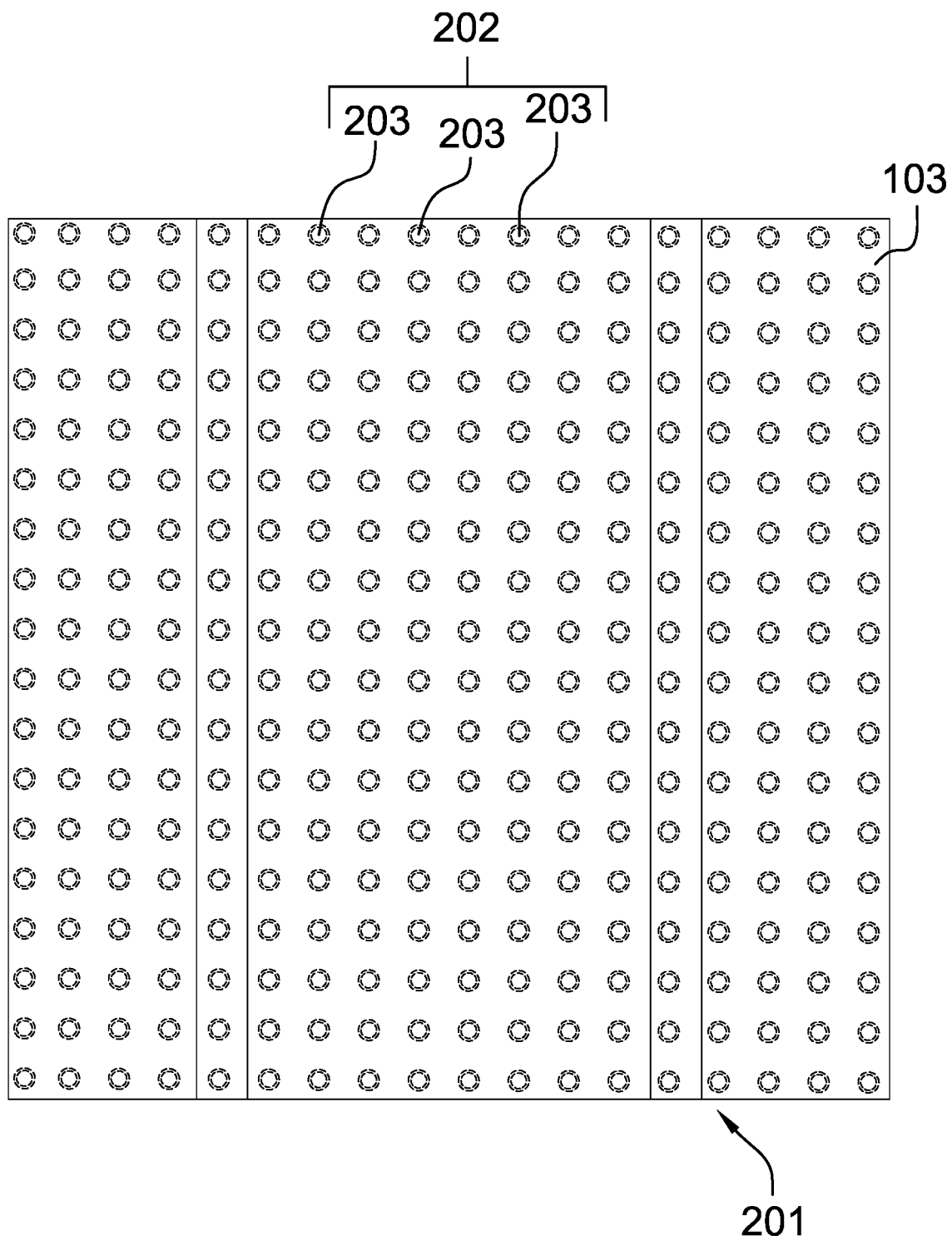
FIG. 13 is a detail view of an alternate embodiment of the disclosure.
Figure 14:
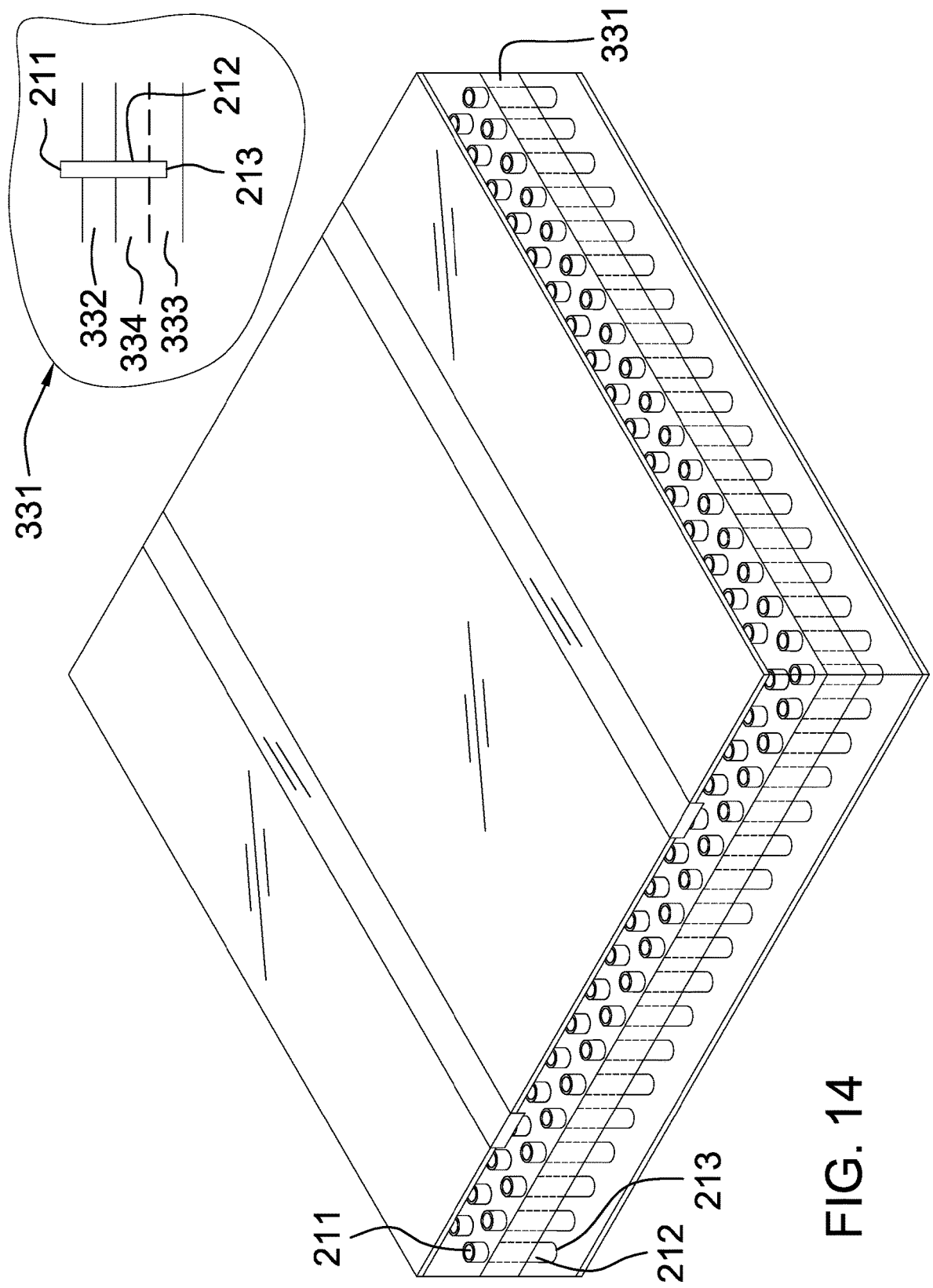
FIG. 14 is a detail view of an alternate embodiment of the disclosure.

Detailed reference will now be made to one or more potential embodiments of the disclosure, which are illustrated in FIGS. 1 through 14.

The improved solar panel is an improvement made to the prior disclosure. The improved solar panel comprises the photovoltaic collection system 103, the lens structure 104 and a calliport structure 201. The calliport structure 201 is a photon manifold. The calliport structure 201 is formed in the silicon crystalline structure of the NP junction 331 of each individual photovoltaic cell 132 contained within the photovoltaic collection structure 103. The calliport structure 201 captures a proportion of the photons that are redirected by the lens structure 104. The calliport structure 201 discharges the redirected photons into the N crystalline layer 332 and the P crystalline layer 333 through refraction and ejection processes. The calliport structure 201 directly injects photons into the depletion zone 334 of the P crystalline layer 331 such that the net electric current production of the individual photovoltaic cell 132 is increased relative to a standard photoelectric cell.

The photovoltaic collection system 103 is a photoelectric structure. The photovoltaic collection system 103 receives light that is captured and concentrated by the lens structure 104. The photovoltaic collection system 103 converts the received light into electric energy. The electric energy generated by the photovoltaic collection system 103 is transmitted to an externally provided load. The photovoltaic collection system 103 is described in greater detail in the prior disclosure. The photovoltaic collection system 103 comprise a plurality of photovoltaic cells 131. The plurality of photovoltaic cells 131 comprises a collection of individual photovoltaic cells 132.

The plurality of photovoltaic cells 131 are described in greater detail in the prior disclosure. Each individual photovoltaic cell 132 selected from the plurality of photovoltaic cells 131 is a photoelectric device that is described elsewhere in this disclosure.

Each individual photovoltaic cell 132 selected from the plurality of photovoltaic cells 131 further comprises an NP junction 331. The NP junction 331 further comprises an N crystalline layer 332, a P crystalline layer 333, and a depletion zone 334. The NP junction 331, the N crystalline layer 332, the P crystalline layer 333, and the depletion zone 334 are described in greater detail elsewhere in this disclosure.

The lens structure 104 is an optical device. The lens structure 104 accumulates light from the environment. The lens structure 104 redirects light that would otherwise not fall on an individual photovoltaic cell 132 selected from the plurality of photovoltaic cells 131 to an individual photovoltaic cell 132 for conversion into electricity. The lens structure 104 further redirects light that would otherwise not fall on an individual photovoltaic cell 132 selected from the plurality of photovoltaic cells 131 into the calliport structure 201 for transport into the NP junction 331 of a selected individual photovoltaic cell 132. The lens structure 104 comprises a plurality of pyramid lenses 141. The plurality of pyramid lenses 141 comprise a collection of individual pyramid lens 142. The lens structure 104, the plurality of pyramid lenses, and the individual pyramid lens are described in greater detail in the prior disclosure.

The calliport structure 201 is a photon manifold. The calliport structure 201 receives redirected photons from the lens structure 104. The calliport structure 201 transports the redirected photons through the NP junction 331 of an individual photovoltaic cell 132 selected from the plurality of photovoltaic cells 131. The calliport structure 201 ejects a portion of the transported photons into the NP junction 331 of the individual photovoltaic cell 132 selected from the plurality of photovoltaic cells 131. The calliport structure 201 increases the electric energy output of each selected individual photovoltaic cell 132 by discharging photons directly into the depletion zone 334 of the NP junction 331. The calliport structure 201 comprises a plurality of fiber optic cable structures 202. The plurality of fiber optic cable structures comprises a collection of individual fiber optic cable structures 203.

The plurality of fiber optic cable structures 202 forms the physical structure that transports photons into the NP junction 331 of an individual photovoltaic cell 132 selected from the plurality of photovoltaic cells 131. The plurality of fiber optic cable structures 202 forms a transport network that is distributed through each NP junction 331. The plurality of fiber optic cable structures 202 is formed within the NP junction 331 such that the crystalline structure of the NP junction 331 is grown around the plurality of fiber optic cable structures 202.

Each individual fiber optic cable structure 203 selected from the plurality of fiber optic cable structures 202 is a fiber optic cable. The fiber optic cable is defined elsewhere in this disclosure. Each selected individual fiber optic cable structure 203 forms the physical structure that transports photons into the NP junction 331. Each selected individual fiber optic cable structure 203 discharges a portion of the transported photons into the NP junction 331.

Each selected individual fiber optic cable structures 203 discharges the photons through two methods. The first method is that each selected individual fiber optic cable structure 203 ejects the photons directly into the NP junction 331 from a termination point of the selected individual fiber optic cable structures 203. The second method is that each selected individual fiber optic cable structure 203 ejects the photons through a refraction mechanism. The refraction mechanism allows a portion of the electrons that reflect off the interior transport channel boundary of the NP junction 331 to physically escape from the selected individual fiber optic cable structures 203 into the NP junction 331.

Each individual fiber optic cable structure 203 selected from the plurality of fiber optic cable structures 202 comprises a photon intake structure 211, a photon flow path 212, and a terminal discharge point 213.

The photon intake structure 211 is an interface structure. The photon intake structure 211 forms an interface with one or more individual pyramid lens 142 selected from the plurality of pyramid lenses 141 of the lens structure 104. The photon intake structure 211 receives a plurality of redirected photons from the lens structure 104. The photon intake structure 211 transports the received redirected photons to the photon flow path 212.

The photon flow path 212 is the fiber optic cable that transports the redirected photons through the NP junction 331. The crystalline structure of the NP junction 331 is grown around each photon flow path 212. The photon flow path 212 transports a portion of the redirected photons to the terminal discharge point 213. The balance of the redirected photons escapes from the photon flow path 212 through the refraction mechanism.

The terminal discharge point 213 forms a termination point of the photon flow path 212. The terminal discharge point 213 is the termination of the photon flow path 212 that is distal from the lens structure 104. The terminal discharge point 213 ejects the transported redirected photons into the NP junction 331.

The following definitions were used in this disclosure:

Align: As used in this disclosure, align refers to an arrangement of objects that are: 1) arranged in a straight plane or line; 2) arranged to give a directional sense of a plurality of parallel planes or lines; or, 3) a first line or curve is congruent to and overlaid on a second line or curve.

Cant: As used in this disclosure, a cant is an angular deviation from one or more reference lines (or planes) such as a vertical line (or plane) or a horizontal line (or plane).

Center: As used in this disclosure, a center is a point that is: 1) the point within a circle that is equidistant from all the points of the circumference; 2) the point within a regular polygon that is equidistant from all the vertices of the regular polygon; 3) the point on a line that is equidistant from the ends of the line; 4) the point, pivot, or axis around which something revolves; or, 5) the centroid or first moment of an area or structure. In cases where the appropriate definition or definitions are not obvious, the fifth option should be used in interpreting the specification.

Center Axis: As used in this disclosure, the center axis is the axis of a cylinder or a prism. The center axis of a prism is the line that joins the center point of the first congruent face of the prism to the center point of the second corresponding congruent face of the prism. The center axis of a pyramid refers to a line formed through the apex of the pyramid that is perpendicular to the base of the pyramid. When the center axes of two cylinder, prism or pyramidal structures share the same line they are said to be aligned. When the center axes of two cylinder, prism or pyramidal structures do not share the same line they are said to be offset.

Collimate: As used with this disclosure, the verb to collimate means to redirect or align rays of electromagnetic radiation. Methods commonly used to collimate electromagnetic radiation include, but are not limited to: a) aligning a device that is sensitive to electromagnetic radiation with a source of electromagnetic radiation; and, b) redirecting the path of electromagnetic radiation to align the rays of the electromagnetic radiation with the device that is sensitive to electromagnetic radiation.

Composite Prism: As used in this disclosure, a composite prism refers to a structure that is formed from a plurality of structures selected from the group consisting of a prism structure and a pyramid structure. The plurality of selected structures may or may not be truncated. The plurality of prism structures are joined together such that the center axes of each of the plurality of structures are aligned. The congruent ends of any two structures selected from the group consisting of a prism structure and a pyramid structure need not be geometrically similar.

Concave: As used in this disclosure, concave is used to describe: 1) a surface that resembles the interior surface of a sphere; or, 2) a function with a curvature structure wherein a chord that connects any two points of the function will be lesser than (graphically below) or equal to the value of the function at any point along the chord.

Congruent: As used in this disclosure, congruent is a term that compares a first object to a second object. Specifically, two objects are said to be congruent when: 1) they are geometrically similar; and, 2) the first object can superimpose over the second object such that the first object aligns, within manufacturing tolerances, with the second object.

Convex: As used in this disclosure, convex is used to describe: 1) a surface that resembles the outer surface of a sphere; or, 2) a function with a curvature structure wherein a chord that connects any two points of the function will be greater than (graphically above) or equal to the value of the function at any point along the chord.

Correspond: As used in this disclosure, the term correspond is used as a comparison between two or more objects wherein one or more properties shared by the two or more objects match, agree, or align within acceptable manufacturing tolerances.

Diffraction: As used in this disclosure, diffraction refers to the expansion of the field of illumination of a ray of light as it passes an edge that blocks a portion of the field of illumination of the ray of light. Diffraction can occur around an edge or a slit. Diffraction is a wave property of light.

Disk: As used in this disclosure, a disk is a prism-shaped object that is flat in appearance. The disk is formed from two congruent ends that are attached by a lateral face. The sum of the surface areas of two congruent ends of the prism-shaped object that forms the disk is greater than the surface area of the lateral face of the prism-shaped object that forms the disk. In this disclosure, the congruent ends of the prism-shaped structure that forms the disk are referred to as the faces of the disk.

Electromagnetic Radiation: As used in this disclosure, electromagnetic radiation refers to an interaction between electric fields and magnetic fields that is capable of transmitting energy through a vacuum.

Exterior: As used in this disclosure, the exterior is used as a relational term that implies that an object is not contained within the boundary of a structure or a space.

Fiber Optic Cable: As used in this disclosure, a fiber optic cable is a glass or plastic cable that is used to transmit or conduct light instead of electricity.

Field of Illumination: As used in this disclosure, a field of illumination refers to an area illuminated by electromagnetic radiation projected from an electrical device such as a lamp or transmission antenna.

Focal Point: As used in this disclosure, a focal point is a physical location along an axis of symmetry of an optical system comprising lenses or mirrors wherein: 1) a plurality of parallel rays that are processed by the optical system comprising lenses or mirrors appears to converge; or, 2) a plurality of parallel rays that are processed by the optical system comprising lenses or mirrors appears to diverge.

Form Factor: As used in this disclosure, the term form factor refers to the size and shape of an object.

Geometrically Similar: As used in this disclosure, geometrically similar is a term that compares a first object to a second object wherein: 1) the sides of the first object have a one to one correspondence to the sides of the second object; 2) wherein the ratio of the length of each pair of corresponding sides are equal; 3) the angles formed by the first object have a one to one correspondence to the angles of the second object; and, 4) wherein the corresponding angles are equal. The term geometrically identical refers to a situation where the ratio of the length of each pair of corresponding sides equals 1.

Interior: As used in this disclosure, the interior is used as a relational term that implies that an object is contained within the boundary of a structure or a space.

Lens: As used in this disclosure, a lens is a transparent substance through which electromagnetic radiation can pass. The lens refracts the electromagnetic radiation as it passes through the lens. A lens may or may not be formed with curved surfaces that are used to concentrate or disperse the electromagnetic radiation that travels through the lens. A lens can also project a focused image on a surface known as a virtual image. A lens may also be used to change the apparent size of the virtual image. A magnifying lens (also known as a magnifying glass) is a lens that increase the apparent size of a virtual image. A contact lens is a lens that is worn directly on the eye of a patient.

Light: As used in this disclosure, light refers to electromagnetic radiation that illuminates an area. Illumination is a synonym for light, particularly in cases where a measure of the amount of light in a space is called for.

Load: As used in this disclosure, the term load refers to an object upon which a force is acting or which is otherwise absorbing energy in some fashion. Examples of a load in this sense include, but are not limited to, a mass that is being moved a distance or an electrical circuit element that draws energy. The term load is also commonly used to refer to the forces that are applied to a stationary structure.

Load Path: As used in this disclosure, a load path refers to a chain of one or more structures that transfers a load generated by a raised structure or object to a foundation, supporting surface, or the earth.

Manifold: As used in this disclosure, a manifold is a pipe or chamber having several ports through which one or more substances are gathered or distributed.

N-gon: As used in this disclosure, an N-gon is a regular polygon with N sides wherein N is a positive integer number greater than 2.

Negative Space: As used in this disclosure, negative space is a method of defining an object through the use of open or empty space as the definition of the object itself, or, through the use of open or empty space to describe the boundaries of an object.

Network: As used in this disclosure, a network refers to a transport structure that: a) receives a flow of a substance into the network; b) transports the substance through a series of conduits, controlling structures, and manifolds; and, c) discharges the substance from the network.

Not Significantly Different: As used in this disclosure, the term not significantly different compares a specified property of a first object to the corresponding property of a reference object (reference property). The specified property is considered to be not significantly different from the reference property when the absolute value of the difference between the specified property and the reference property is less than 10.0% of the reference property value. A negligible difference is considered to be not significantly different.

One to One: When used in this disclosure, a one to one relationship means that a first element selected from a first set is in some manner connected to only one element of a second set. A one to one correspondence means that the one to one relationship exists both from the first set to the second set and from the second set to the first set. A one to one fashion means that the one to one relationship exists in only one direction.

Pan: As used in this disclosure, a pan is a hollow and prism-shaped containment structure. The pan has a single open face. The open face of the pan is often, but not always, the superior face of the pan. The open face is a surface selected from the group consisting of: a) a congruent end of the prism structure that forms the pan; and, b) a lateral face of the prism structure that forms the pan. A semi-enclosed pan refers to a pan wherein the closed end of prism structure of the pan and/or a portion of the closed lateral faces of the pan are open.

Perimeter: As used in this disclosure, a perimeter is one or more curved or straight lines that bounds an enclosed area on a plane or surface. The perimeter of a circle is commonly referred to as a circumference.

Photoelectric: As used in this disclosure, photoelectric is an adjective used to describe an electronic component in which the performance of the electronic component is modified by light. Typical photoelectric devices include, but are not limited to, photoelectric transistors, photoelectric diodes, and photoelectric resistors.

Photon: As used in this disclosure, a photon refers to the elementary particle of quantum mechanics that transmits the energy of electromagnetic radiation. The energy contained in a photon is determined by the frequency of the wave structure of the photon.

Photovoltaic Cell: As used in this disclosure, a photovoltaic cell is a photoelectric device that directly converts light energy into electrical energy.

Primary Shape: As used in this disclosure, the primary shape refers to a description of the rough overall geometric shape of an object that is assembled from multiple components or surfaces.

Prism: As used in this disclosure, a prism is a three-dimensional geometric structure wherein: 1) the form factor of two faces of the prism are congruent; and, 2) the two congruent faces are parallel to each other. The two congruent faces are also commonly referred to as the ends of the prism. The surfaces that connect the two congruent faces are called the lateral faces. In this disclosure, when further description is required a prism will be named for the geometric or descriptive name of the form factor of the two congruent faces. If the form factor of the two corresponding faces has no clearly established or well-known geometric or descriptive name, the term irregular prism will be used. The center axis of a prism is defined as a line that joins the center point of the first congruent face of the prism to the center point of the second corresponding congruent face of the prism. The center axis of a prism is otherwise analogous to the center axis of a cylinder. A prism wherein the ends are circles is commonly referred to as a cylinder.

Prism and Pyramid Lenses: As used in this disclosure, a prism lens is a lens that is formed in the shape of a triangular prism. The prism lens refracts light such that the changes the apparent position of a source of electromagnetic radiation to a device that is sensitive to electromagnetic radiation is differs from the actual position of the apparent position of a source of electromagnetic radiation relative to electromagnetically sensitive device. The prism lens does not generally change the focus length or size of an object within the field of view of the prism lens. A pyramid lens is similar to a prism lens, but has the shape of a pyramid.

Pyramid: As used in this disclosure, a pyramid is a three-dimensional shape that comprises a base formed in the shape of an N-gon (wherein N is an integer) with N triangular faces that rise from the base to converge at a point above the base. The center axis of a pyramid is the line drawn from the vertex where the N faces meet to the center of the N-gon base. The center axis of a right pyramid is perpendicular to the N-gon base. Pyramids can be further formed with circular or elliptical bases which are commonly referred to as a cone or an elliptical pyramid respectively. A pyramid is defined with a base, an apex, and a lateral face. The base is the N-gon shaped base described above. The apex is the vertex that defines the center axis. The lateral face is formed from the N triangular faces described above.

Offset: As used in this disclosure, an offset refers to two objects are not in alignment. An offset also refers to the span of distance or cant by which two objects are out of alignment.

Radiation: As used in this disclosure, radiation refers to the discharge of energy from an object. The term is often applied to energy in the form of: a) waves, such as electromagnetic radiation or acoustic energy; b) nuclear radiation such as alpha, beta, and gamma, particle radiation; and, c) gravitational waves. The radiation of electromagnetic waves is often classified by the wavelength of the generated waves, such as ultraviolet and infrared radiation.

Reflection: As used in this disclosure, reflection refers to the change in the direction of a wave as the wave hits the boundary between two media. The direction of the reflected wave remains within the media through which the wave traveled to reach the boundary.

Refraction: As used in this disclosure, refraction refers to a change in angle of a wave direction (typically electromagnetic radiation or light) as the wave moves through a surface formed a first transparent material into a second transparent material. The angle is measured relative to an axis that is perpendicular to the surface at the point of contact with the wave. The relationship between the angle of the wave direction (relative to the perpendicular) through the first material and the angle of the wave direction (relative to the perpendicular) through the second material is given by Snell's Law. Snell's law states that $n1*\sin(a1)=n2*\sin(a2)$ where nx is the index of refraction of material x and ax is the angle relative to the perpendicular in through material x. In this example, x is taken to be selected from the group consisting of the first transparent material and the second transparent material. The index of refraction is an empirically measured value. The index of refraction of a vacuum and the atmosphere is 1.0. The index of refraction of water is 1.33. The reported index of refraction of octane ranges between 1.38 and 1.40.

Roughly: As used in this disclosure, roughly refers to a comparison between two objects. Roughly means that the difference between one or more parameters of the two compared objects are not significantly different.

Sandwich: As used in this disclosure, to sandwich means to insert a first disk-shaped structure between a second disk-shaped structure and a third disk-shaped structure to form a composite prism structure. Specifically: a) a first congruent end of the first disk-shaped structure is placed against a first interior congruent end of the second disk-shaped structure; and, b) a second congruent end of the first disk-shaped structure is placed against a second interior congruent end of the third disk-shaped structure. A first exterior congruent end of the second disk-shaped structure forms a first overall congruent end of the overall composite prism structure described in this definition. A second exterior congruent end of the third disk-shaped structure forms a second overall congruent end of the overall composite prism structure described in this definition. The second overall congruent end of the overall composite prism structure is distal from the first overall congruent end. The verb to sandwich describes the act of placing the second disk-shaped structure between the first disk-shaped structure and the third disk-shaped structure.

Transparent: As used in this disclosure, transparent refers to a material that allows light to pass through the material without significant scattering such that an object can be clearly seen through the material.

Visible Light: As used in this disclosure, visible light refers electromagnetic radiation with a wavelength in the approximate range of 400 nanometers to 800 nanometers.

Wave: As used in this disclosure, a wave is a mechanism capable of transferring energy without transferring mass. Specifically, a wave refers to a transfer of momentum or energy through an object or medium such that there is no significant change in the relative positions of the particles (or molecules) that make up the object or medium.

With respect to the above description, it is to be realized that the optimum dimensional relationship for the various components of the invention described above and in FIGS. 1 through 14 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. An improved solar panel comprising
a photovoltaic collection system, a lens structure and a calliport structure;
wherein the photovoltaic collection system, the lens structure and the calliport structure forms a light distribution structure;
wherein a plurality of photovoltaic cells comprises a collection of individual photovoltaic cells;
wherein each individual photovoltaic cell selected from the plurality of photovoltaic cells is a photoelectric device;
wherein each individual photovoltaic cell selected from the plurality of photovoltaic cells further comprises an NP junction;
wherein the calliport structure is formed in a silicon crystalline structure of an NP junction in each individual photovoltaic cell contained within the photovoltaic collection structure;
wherein the NP junction further comprises an N crystalline layer, a P crystalline layer, and a depletion zone;
wherein the calliport structure comprises a plurality of fiber optic cable structures;
wherein the plurality of fiber optic cable structures comprises a collection of individual fiber optic cable structures;
wherein each individual fiber optic cable structure selected from the plurality of fiber optic cable structures comprises a photon intake structure, a photon flow path, and a terminal discharge point;
wherein the photon intake structure is an interface structure;
wherein the photon intake structure forms an interface with one or more individual pyramid lens selected from a plurality of pyramid lenses of the lens structure;
wherein the photon intake structure receives a plurality of redirected photons from the lens structure;
wherein the photon intake structure transports the received redirected photons to the photon flow path;
wherein the photon flow path is the fiber optic cable that transports the redirected photons through the NP junction;
wherein the crystalline structure of the NP junction is grown around each photon flow path;
wherein the photon flow path transports a portion of the redirected photons to the terminal discharge point;
wherein the balance of the redirected photons escapes from the photon flow path through the refraction mechanism;
wherein the terminal discharge point forms a termination point of the photon flow path;
wherein the terminal discharge point is the termination of the photon flow path that is distal from the lens structure;
wherein the terminal discharge point ejects the transported redirected photons into the NP junction.

2. The improved solar panel according to claim 1 wherein the calliport structure is a photon manifold.

3. The improved solar panel according to claim 2
wherein the photovoltaic collection system is a photoelectric structure;
wherein the photovoltaic collection system receives light that is captured and concentrated by the lens structure;
wherein the photovoltaic collection system converts the received light into electric energy.

4. The improved solar panel according to claim 3
wherein the photovoltaic collection system comprise a plurality of photovoltaic cells.

5. The improved solar panel according to claim 4
wherein the lens structure is an optical device;
wherein the lens structure accumulates light from the environment;
wherein the lens structure redirects light that would otherwise not fall on an individual photovoltaic cell selected from the plurality of photovoltaic cells to an individual photovoltaic cell for conversion into electricity;
wherein the lens structure further redirects light that would otherwise not fall on an individual photovoltaic cell selected from the plurality of photovoltaic cells into the calliport structure for transport into the NP junction of a selected individual photovoltaic cell;

wherein the lens structure comprises the plurality of pyramid lenses;

wherein the plurality of pyramid lenses comprise a collection of individual pyramid lenses.

6. The improved solar panel according to claim 5 wherein the calliport structure captures a proportion of the photons that are redirected by the lens structure;

wherein the calliport structure discharges the redirected photons into the N crystalline layer and the P crystalline layer through refraction and ejection processes;

wherein the calliport structure directly injects photons into the depletion zone of the P crystalline layer.

7. The improved solar panel according to claim 6 wherein the calliport structure transports the redirected photons through the NP junction of an individual photovoltaic cell selected from the plurality of photovoltaic cells;

wherein the calliport structure ejects a portion of the transported photons into the NP junction of the individual photovoltaic cell selected from the plurality of photovoltaic cells.

8. The improved solar panel according to claim 7 wherein the plurality of fiber optic cable structures forms the physical structure that transports photons into the NP junction of an individual photovoltaic cell selected from the plurality of photovoltaic cells;

wherein the plurality of fiber optic cable structures forms a transport network that is distributed through each NP junction;

wherein the plurality of fiber optic cable structures is formed within the NP junction such that the crystalline structure of the NP junction is grown around the plurality of fiber optic cable structures.

9. The improved solar panel according to claim 8 wherein each individual fiber optic cable structure selected from the plurality of fiber optic cable structures is a fiber optic cable;

wherein each selected individual fiber optic cable structure forms the physical structure that transports photons into the NP junction;

wherein each selected individual fiber optic cable structure discharges a portion of the transported photons into the NP junction.

\* \* \* \* \*